US012652838B2

(12) United States Patent
Tawara et al.

(10) Patent No.: US 12,652,838 B2
(45) Date of Patent: Jun. 9, 2026

(54) SILICON CARBIDE SEMICONDUCTOR DEVICE

(71) Applicant: FUJI ELECTRIC CO., LTD.,
Kawasaki (JP)

(72) Inventors: Takeshi Tawara, Tsukuba-city (JP);
Shinsuke Harada, Tsukuba-city (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 442 days.

(21) Appl. No.: 18/477,138

(22) Filed: Sep. 28, 2023

(65) Prior Publication Data

US 2024/0038851 A1 Feb. 1, 2024

Related U.S. Application Data

(63) Continuation of application No.
PCT/JP2022/020445, filed on May 16, 2022.

(30) Foreign Application Priority Data

May 18, 2021 (JP) ................................. 2021-083803

(51) Int. Cl.
*H01L 29/36* (2006.01)
*H01L 29/16* (2006.01)
(Continued)

(52) U.S. Cl.
CPC ........... *H10D 62/60* (2025.01); *H10D 30/615*
(2025.01); *H10D 62/8325* (2025.01); *H10D*
*64/513* (2025.01); *H10D 12/031* (2025.01)

(58) Field of Classification Search
CPC .. H10D 12/031; H10D 30/668; H10D 30/615;
H10D 30/0297; H10D 62/393; H10D
62/127; H10D 64/513
See application file for complete search history.

(56) References Cited

U.S. PATENT DOCUMENTS

2015/0087125 A1 3/2015 Nishio et al.
2016/0087044 A1* 3/2016 Iijima .................. H10D 64/693
257/77
(Continued)

FOREIGN PATENT DOCUMENTS

JP 2011-159797 A 8/2011
JP 2012-169385 A 9/2012
(Continued)

OTHER PUBLICATIONS

International Search Report for International Application No. PCT/
JP2022/020445, issued on Jul. 26, 2022.
(Continued)

*Primary Examiner* — Lawrence C Tynes, Jr.
(74) *Attorney, Agent, or Firm* — Rabin & Berdo, P.C.

(57) ABSTRACT

A silicon carbide semiconductor device has an n-type silicon
carbide semiconductor substrate, an n-type first semicon-
ductor layer, n-type first JFET regions, a p-type second
semiconductor layer, n-type first semiconductor regions, and
trenches. The first semiconductor layer has an impurity
concentration lower than that of the substrate. The first JFET
regions are provided in a surface layer of the first semicon-
ductor layer and have an effective donor concentration
higher than that of the first semiconductor. The p-type
second semiconductor layer is provided at a surface of the
first semiconductor layer. The n-type first semiconductor
regions are selectively provided in a surface layer of the
second semiconductor layer. The trenches penetrate through
the first semiconductor regions, the second semiconductor
layer, and the first JFET regions. The first JFET regions are
doped with an acceptor that is aluminum and a donor that is
nitrogen or phosphorus.

9 Claims, 10 Drawing Sheets

(51) Int. Cl.
    *H10D 30/60*     (2025.01)
    *H10D 62/60*     (2025.01)
    *H10D 62/832*     (2025.01)
    *H10D 64/27*     (2025.01)
    *H10D 12/01*     (2025.01)

(56)               References Cited

U.S. PATENT DOCUMENTS

| | | | |
|---|---|---|---|
| 2017/0054017 A1 | 2/2017 | Takaki et al. | |
| 2018/0138274 A1* | 5/2018 | Ohse | H10D 62/8325 |
| 2018/0358444 A1* | 12/2018 | Ryo | H10D 62/53 |
| 2020/0365725 A1* | 11/2020 | Ueno | H10D 62/393 |
| 2022/0109049 A1 | 4/2022 | Miyazato | |
| 2023/0100453 A1 | 3/2023 | Tawara et al. | |

FOREIGN PATENT DOCUMENTS

| | | |
|---|---|---|
| JP | 2019-003969 A | 1/2019 |
| WO | 2015/198468 A1 | 12/2015 |
| WO | 2022/025010 A1 | 2/2022 |

OTHER PUBLICATIONS

Written Opinion for International Application No. PCT/JP2022/020445, issued on Jul. 26, 2022.
Office Action of German Patent Application No. 11 2022 000 976.4 dated Aug. 7, 2025.

* cited by examiner

SILICON CARBIDE SEMICONDUCTOR DEVICE

CROSS REFERENCE TO RELATED APPLICATIONS

This is a continuation application of International Application PCT/JP2022/020445 filed on May 16, 2022 which claims priority from a Japanese Patent Application No. 2021-083803 filed on May 18, 2021, the contents of which are incorporated herein by reference.

BACKGROUND OF THE INVENTION

1. Field of the Invention

Embodiments of the invention relate to a silicon carbide semiconductor device.

2. Description of the Related Art

Single crystal silicon (Si) is conventionally used as a material of power semiconductor devices that control high voltages and large currents. Silicon power semiconductor devices include various types that are selectively used according to purpose. For example, PiN diodes (P-intrinsic-N diodes), bipolar transistors, and insulated gate bipolar transistors (IGBTs) are so-called bipolar devices. While these devices have a high current density, high-speed switching is not possible and, for example, the frequency usage limit is several kHz for bipolar transistors and about 20 kHz for IGBTs. On the other hand, while power metal oxide semiconductor field effect transistors (MOSFETs), which are unipolar devices, can be used at high speeds up to several MHz, MOSFETs cannot handle large currents. Nonetheless, there is a strong demand in the market for large-current, high-speed power semiconductor devices and thus, IGBTs and power MOSFETs have been intensively developed and improved, and the performance of power devices has substantially reached the theoretical limit determined by the silicon material.

Further, new materials for power semiconductor devices have been investigated and silicon carbide (SiC) is expected as a material for forming next-generation power semiconductor devices excelling in terms of having low ON voltage, high-speed characteristics, and high-temperature characteristics and has recently attracted particular attention. A reason for this is that SiC is an extremely stable material chemically, has a wide band gap of 3 eV, may be used very stably as a semiconductor even at high temperatures, and further has a critical field strength that is at least one order of magnitude greater than that of silicon. SiC has a good possibility of exceeding the material limits of silicon and therefore, future growth in power semiconductor applications is expected to be significant.

As for silicon carbide semiconductor devices, Schottky barrier diodes (SBDs), planar gate structure and trench gate structure vertical metal oxide semiconductor field effect transistors (MOSFETs) have been commercialized.

A planar gate structure is a MOS gate structure, in which a MOS gate is provided in a plate-like shape on a front surface of a semiconductor substrate. A trench gate structure is a MOS gate structure in which a MOS gate is embedded in a trench formed in a semiconductor substrate (semiconductor chip) at the front surface of the semiconductor substrate and along sidewalls of the trench, a channel (inversion layer) is formed in a direction orthogonal to the front surface of the semiconductor substrate. Therefore, compared to a planar gate structure in which a channel is formed along the front surface of the semiconductor substrate, a density of unit cells (constituent unit of a device) per unit area may be increased and current density per unit area may be increased, which are advantageous in terms of cost.

In such a trench gate structure, to prevent concentration of electric field at the trench bottom, $p^+$-type base regions are selectively provided at the trench bottoms and between trenches. In a trench gate MOSFET with a breakdown voltage of 1.2 kV and formed on a 4H—SiC substrate, an n-type region (JFET region) between a sidewall of the trench and a $p^+$-type base region between trenches is formed by a layer ion-implanted with only nitrogen (N) at an impurity concentration of $1 \times 10^{17}/\mathrm{cm}^3$.

Further, a technique of forming regions of differing carrier concentrations (channel resistance adjusting regions) in a surface layer of a well region to thereby suppress saturation current and enhance short-circuit capability as compared to a semiconductor device in which channel portions have the same on-resistance and carrier concentration that is uniform has been proposed (for example, refer to International Publication No. WO 2015/198468).

Further, a technique of reducing on-resistance and reducing overcurrent during short-circuit by setting the length of a JFET region to 3 μm or less and setting the impurity density Nd of the JFET region to $1 \times 10^{16}$ cm$^{-3}$ or more, which is the impurity density of a drift layer, has been proposed (for example, refer to Japanese Laid-Open Patent Publication No. 2011-159797).

SUMMARY OF THE INVENTION

According to an embodiment of the present invention, a silicon carbide semiconductor device includes: a silicon carbide semiconductor substrate of an n-type and having a first main surface and a second main surface that are opposite to each other; a first semiconductor layer of the n-type, provided at the first main surface of the silicon carbide semiconductor substrate, the first semiconductor layer having an impurity concentration lower than an impurity concentration of the silicon carbide semiconductor substrate, the first semiconductor layer having a first surface and a second surface that are opposite to each other, the second surface facing the silicon carbide semiconductor substrate; a first JFET region of the n-type, provided in the first semiconductor layer, at the first surface thereof, the first JFET region having an effective donor concentration that is higher than an effective donor concentration of the first semiconductor layer; a second semiconductor layer of a p-type, provided at the first surface of the first semiconductor layer, the second semiconductor layer having a first surface and a second surface that are opposite to each other, the second surface of the second semiconductor layer facing the first semiconductor layer; a first semiconductor region of the n-type, selectively provided in the second semiconductor layer, at the first surface thereof; a trench penetrating through the first semiconductor region, the second semiconductor layer, and the first JFET region; a gate electrode provided in the trench, via a gate insulating film; an interlayer insulating film provided on the gate electrode; a first electrode in contact with the first semiconductor region and the second semiconductor layer; and a second electrode provided at the second main surface of the silicon carbide semiconductor substrate. In a layer or a region, an effective donor concentration thereof is obtained by subtracting a concentration of an acceptor thereof from a concentration of a donor thereof. The first JFET region is doped with an acceptor that is aluminum and with a donor that is nitrogen or phosphorus, a concentration of the donor is greater than a concentration of the acceptor.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a plan view depicting the structure of the silicon carbide semiconductor device according to the embodiment, along cutting line C-C' in FIG. 1.

FIG. 8 is a graph showing a relationship between the effective donor concentration of the JFET_1 region and on-resistance (RonA), and a relationship between the effective donor concentration of the JFET_1 region and breakdown voltage (BV).

FIG. 9A is cross-sectional view depicting electric field of a portion surrounded by a dashed line in FIG. 9B, when the silicon carbide semiconductor device is off.

4

Figure 17:
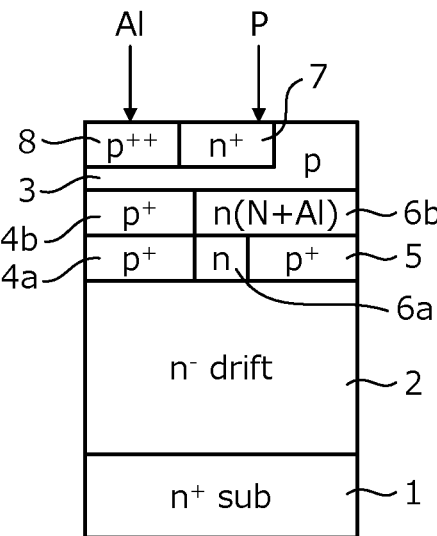

FIG. 17 is a cross-sectional view depicting a state of the silicon carbide semiconductor device according to the embodiment during manufacture.

Figure 18:
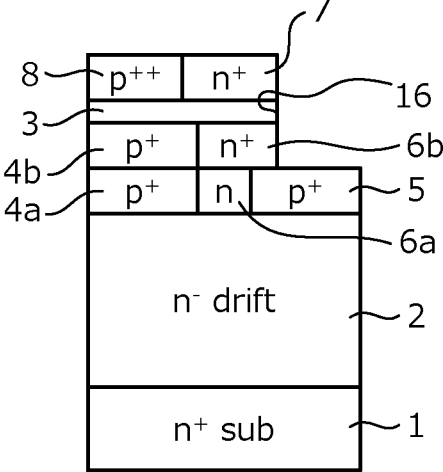

FIG. 18 is a cross-sectional view depicting a state of the silicon carbide semiconductor device according to the embodiment during manufacture.

DETAILED DESCRIPTION OF THE INVENTION

First, problems associated with the conventional techniques are discussed. In a MOSFET, during a load short-circuit failure, when short-circuit occurs between the drain and source, high voltage is applied to the device in an on-state, a large current flows instantaneously, and the internal junction temperature rapidly rises to around 1000K. When the internal junction temperature increases, device resistance increases and the current decreases, nonetheless, the device temperature increases which may lead to electrode melting or the like and cause thermal destruction of the device. Therefore, it is desirable for the MOSFET to not be destroyed during the time (about 10 μs or more) it takes for a protective circuit that detects short-circuits and blocks the gate to operate. To this end, short-circuit current has to be small and any thermal loss that occurs has to be small.

Nonetheless, in general, on-resistance and short-circuit capability have a trade-off relationship. In an instance of a low-resistance device with increased channel density such as a trench gate MOSFET, a problem arises in that during short-circuit, a large current flows and thus, compared to a planar gate structure, the short-circuit capability decreases (refer to R. Green, *Mat. Sci. Forum* 924 (2018) pp. 715). The short-circuit capability of a trench-type silicon carbide semiconductor device is low and thus, the device may be thermally destroyed during the time (about 10 μs) that it takes for the protective circuit to operate.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In general, while impurity concentrations are indicated in a format like "3×10$^{17}$/cm$^3$", in the present specification, an abbreviation such as "3e17, 3E17, 3E+17" is also adopted, and the unit of concentration (/cm$^3$) is also omitted when it is clear that the numerical value expresses concentration. In the description of the embodiments below and the accompanying drawings, main portions that are identical will be given the same reference numerals and will not be repeatedly described. Further, with consideration of variation in manufacturing, description indicating the same or equal may be within 5%.

Figure 1:
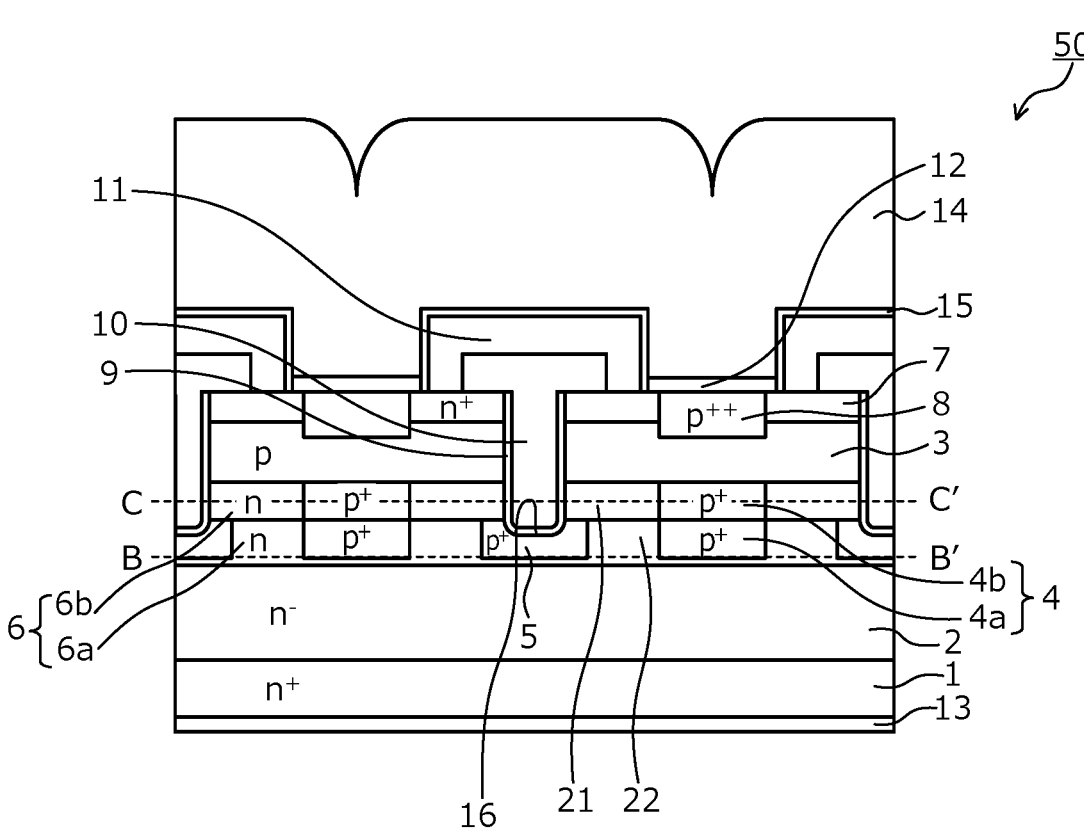
FIG. 1 is cross-sectional view depicting a structure of a silicon carbide semiconductor device according to an embodiment, along cutting line A-A' in FIG. 2.
Figure 2:
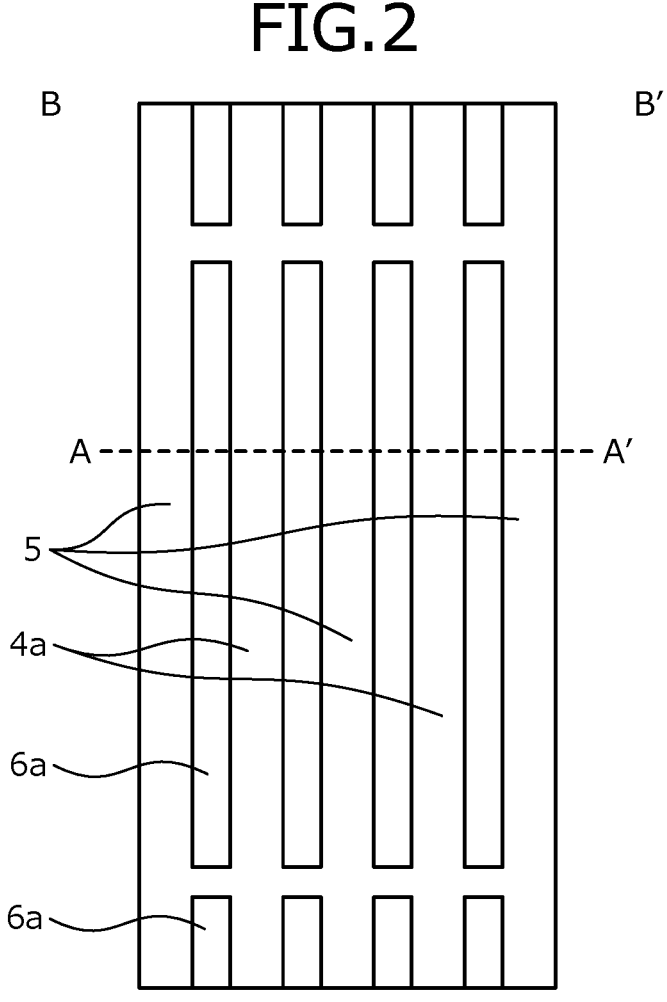
FIG. 2 is a plan view depicting the structure of the silicon carbide semiconductor device according to the embodiment, along cutting line B-B' in FIG. 1.
Figure 3:
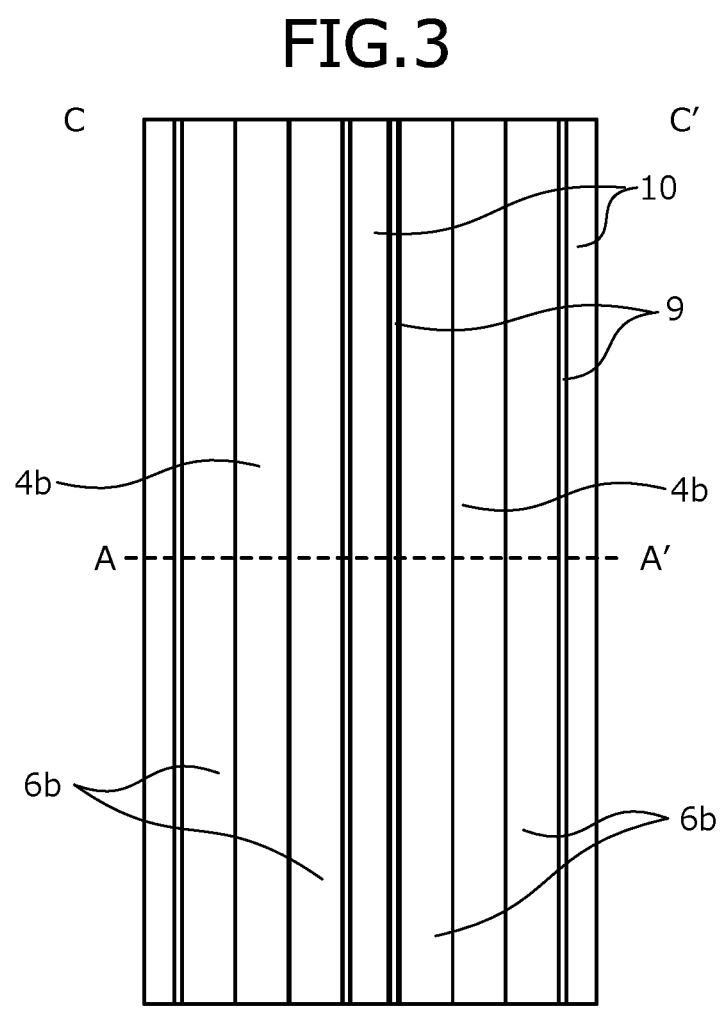

A semiconductor device according to the present invention contains a wide band gap semiconductor. In the embodiment, for example, a silicon carbide semiconductor device fabricated (manufactured) using silicon carbide (SiC) as wide band gap semiconductor is described taking a MOSFET as an example. FIG. 1 is cross-sectional view depicting a structure of the silicon carbide semiconductor device according to the embodiment, along cutting line A-A' in FIG. 2. FIG. 2 is a plan view depicting the structure of the silicon carbide semiconductor device according to the embodiment, along cutting line B-B' in FIG. 1. FIG. 3 is a plan view depicting the structure of the silicon carbide semiconductor device according to the embodiment, along cutting line C-C' in FIG. 1. FIGS. 1 to 3 depict an example of a trench-type MOSFET 50.

As depicted in FIG. 1, in the silicon carbide semiconductor device according to the embodiment, an n$^-$-type silicon carbide epitaxial layer 2 is deposited on a first main surface (front surface) of an n$^+$-type silicon carbide substrate (silicon carbide semiconductor substrate of an n-type) 1, for example, a (0001) plane (Si-face).

The n$^+$-type silicon carbide substrate 1 is a silicon carbide single crystal substrate. The n$^-$-type silicon carbide epitaxial layer 2 has an impurity concentration that is lower than an impurity concentration of the n$^+$-type silicon carbide substrate 1 and, for example, is a low-concentration n-type drift layer. In the n$^-$-type silicon carbide epitaxial layer 2, at a surface thereof opposite to that having the n$^+$-type silicon carbide substrate 1, n-type high-concentration regions 6 are provided. The n-type high-concentration regions 6 are a high-concentration n-type drift layer having an impurity concentration that is lower than the impurity concentration of the n$^+$-type silicon carbide substrate 1 and higher than the impurity concentration of the n$^-$-type silicon carbide epitaxial layer 2. In more detail, the n-type high-concentration regions 6 are formed by first n-type regions 6$a$ and second n-type regions 6$b$. In other words, as functional names of the MOSFET structure, the first n-type regions 6$a$ may be called JFET_2 regions 22 (second JFET regions) and the second n-type regions 6$b$ may be called JFET_1 regions 21 (first JFET regions). Here, in the JFET_1 regions 21, as described hereinafter, both nitrogen (N) and aluminum (Al) are intentionally doped (co-doped) and the doping concentration of N is greater than that of Al. On the other hand, the JFET_2 regions 22 are doped with at least N and may be further intentionally doped with Al.

When Al is intentionally co-doped in the JFET_2 regions 22, depending on the amount thereof, breakdown voltage drops may occur and thus, preferably, the concentration thereof may be less than the Al doping of the JFET_1 regions 21. Respective n-type carrier concentrations of the JFET_1 regions 21 and the JFET_2 regions 22 are set to be lower than that of the n$^+$-type silicon carbide substrate 1 and higher than that of the n$^-$-type silicon carbide epitaxial layer 2. When the carrier concentration of the JFET_2 regions 22 is lowered to the same level as that of the n$^-$-type silicon carbide epitaxial layer 2, device resistance increases and thus, the carrier concentration is raised. Phosphorus may be used as a donor instead of nitrogen.

At surfaces of the n-type high-concentration regions 6, opposite to surfaces thereof facing the n$^+$-type silicon carbide substrate 1, a p-type base layer (second semiconductor layer of a p-type) 3 is provided. Hereinafter, the n$^+$-type silicon carbide substrate 1, the n$^-$-type silicon carbide epitaxial layer 2, and the p-type base layer 3 combined are regarded as a silicon carbide semiconductor base.

At a second main surface (back surface, in other words, a back surface of the silicon carbide semiconductor base) of the n$^+$-type silicon carbide substrate 1, a drain electrode 13 constituting a back electrode is provided. The drain electrode 13 is formed by, for example, sequentially stacking titanium, nickel, and gold. Instead of titanium, molybdenum may be used.

In silicon carbide semiconductor base, at a first main surface side (the p-type base layer 3 side) thereof, a trench structure is formed. In particular, a trench 16 penetrates through the p-type base layer 3, from a side (first main surface side of the silicon carbide semiconductor base) of the p-type base layer 3, opposite to a side thereof facing the n$^+$-type silicon carbide substrate 1 and reaches the n-type high-concentration regions 6. Further, the trench 16 is provided in a stripe shape. Along an inner wall of the trench 16, a gate insulating film 9 is formed at the bottom and sidewalls of the trench 16, and a gate electrode 10 is formed on the gate insulating film 9 in the trench 16. The gate insulating film 9 insulates the gate electrode 10 from the n-type high-concentration regions 6 and the p-type base layer 3. A portion of the gate electrode 10 may protrude toward a source electrode 14, from a top (side where the later-described source electrode 14 is provided) of the trench 16. The top of the gate electrode 10 is covered by an interlayer insulating film 11. The interlayer insulating film 11 is covered by a barrier metal 15 containing titanium or titanium and titanium nitride. The p-type base layer 3 is in contact with first p$^+$-type base regions 4. In the p-type base layer 3, at a substrate first main surface side, n$^+$-type source regions (first semiconductor regions of the n-type) 7 are provided. Further, p$^{++}$-type contact regions 8 may be selectively provided. In this case, the n$^+$-type source regions 7 and the p$^{++}$-type contact regions 8 are in contact with one another. The n$^+$-type source regions 7 and the p$^{++}$-type contact regions 8 are connected to the source electrode 14 via ohmic electrodes 12 containing nickel or the like forming a silicide. The source electrode 14 contains aluminum or an aluminum alloy containing silicon and is connected to an external circuit using a bonding wire containing aluminum or the like.

Furthermore, at a surface of the source electrode 14, a plating film containing nickel/phosphorus may be formed and a wiring conductor may be soldered so as to be connected to an external circuit.

At a surface (first main surface side of the silicon carbide semiconductor base) of the n-type high-concentration regions 6, opposite to a surface thereof facing the n$^+$-type silicon carbide substrate 1, the first p$^+$-type base regions (first base regions of a p-type) 4 are selectively provided. The first p$^+$-type base regions are provided at least in a surface layer of the n-type high-concentration regions 6, at a side (first main surface side of the silicon carbide semiconductor base) thereof opposite to a side thereof facing the n$^+$-type silicon carbide substrate 1. The trench 16 is provided in plural and the first p$^+$-type base regions 4 are apart from the trenches 16 and reach deep positions closer to the drain than is the bottom of the trench 16. In a case where the first p$^+$-type base regions (first base regions of a p-type) 4 are provided, between the trenches 16 provided in plural, the JFET_1 regions 21 are separated by the first p$^+$-type base regions 4.

Second p$^+$-type base regions (second base regions of the p-type) 5 are provided at positions facing bottoms of the trenches 16 in a depth direction. A width of each of the second p$^+$-type base regions 5 is wider than a width of each of the trenches 16. The bottoms of the trenches 16 may reach the second p$^+$-type base regions 5 or may reach positions in the n-type high-concentration regions 6 between the p-type base layer 3 and the second p$^+$-type base regions 5. The first p$^+$-type base regions 4 and the second p$^+$-type base regions 5, for example, are doped with aluminum (Al). When protection is sufficiently performed when avalanche breakdown occurs, the first p$^+$-type base regions 4 may be omitted with the second p$^+$-type base regions 5 at the bottoms of the trenches 16 being provided.

A portion of each of the first p$^+$-type base regions 4 extends toward the trenches, thereby forming a structure in which the first p⁺-type base regions 4 are connected to the second p⁺-type base regions 5. As depicted in FIG. 2, the first p⁺-type base regions 4 include first p⁺-type regions 4a that are closer to the drain than are the bottoms of the trenches 16 and portions of each of the first p⁺-type regions 4a may extend in a direction orthogonal to the direction in which the trenches 16 extend and thereby may be connected to the second p⁺-type base regions 5. The first p⁺-type regions 4a and the second p⁺-type base regions 5 are formed concurrently and are connected to one another thereby forming a grid-like shape in a plan view. Further, in FIG. 1, the first p⁺-type base regions 4 include second p⁺-type regions 4b that are closer to the source than are the bottoms of the trenches 16 and as depicted in FIG. 3, are formed a stripe-like shape in a direction parallel to the direction in which the trenches 16 extend. Further, as depicted in FIG. 1, the second p⁺-type regions 4b are connected to the first p⁺-type regions 4a and the p-type base layer 3. Alternatively, portions of each of the second p⁺-type regions 4b may extend in a direction orthogonal to the direction in which the trenches extend and thereby may be connected to the second p⁺-type base regions 5. The first p⁺-type regions 4a, the second p⁺-type regions 4b, the second p⁺-type base regions 5, and the p-type base layer 3 are connected to one another, whereby holes that are generated when avalanche break-down occurs at junction portions of the second p⁺-type base regions 5 and the n-type high-concentration regions 6 are efficiently migrated to the source electrode 14, thereby reducing the load on the gate insulating film 9 and enabling increased reliability. FIG. 1 depicts a cross-section along cutting line A-A' in FIGS. 2 and 3, the depicted cross-section is a location where the first p⁺-type base regions 4 and the second p⁺-type base regions 5 are disposed apart from one another. Roughly speaking, the device structure above in FIG. 1 may be regarded as a structure in which the first semiconductor layer and the second semiconductor layer are provided on the n⁺-type silicon carbide substrate 1. Here, the first semiconductor layer is a layer collectively including the n⁻-type silicon carbide epitaxial layer 2, the first p⁺-type base regions 4, the second p⁺-type base regions 5, and the n-type high-concentration regions 6. Further, the second semiconductor layer is a collective layer including the p-type base layer 3, which includes the n⁺-type source regions 7 and the p⁺⁺-type contact regions 8.

Figure 4:
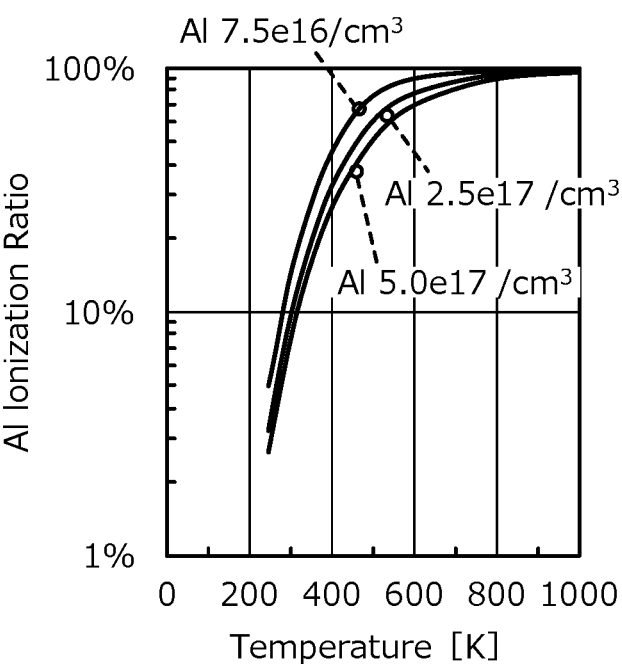
FIG. 4 is a graph of calculation results showing temperature dependence of Al ionization rate.

Here, FIG. 4 is a graph of calculation results showing temperature dependence of the Al ionization rate. In FIG. 4, a vertical axis indicates the Al ionization rate in units of percentage (%). A horizontal axis indicates temperature in units of K. Breakdown temperature of a device during short-circuit is generally known to be about 1000K and thus, temperatures up to 1000K are depicted. As depicted in FIG. 4, the level of Al is deep and thus, while ionization is about 10% to 20% at a temperature close to room temperature, ionization is 100% at high temperatures (800K or high). Within an assumed usage temperature range (233K to 448K) of a semiconductor device, for example, in instances of Al concentrations of 7.5e16, 5.0e16, and 2.5e16/cm³, it is conceivable that the Al ionization rates thereof are in ranges of 3% to 62%, 4% to 68%, and 5% to 78%, respectively.

Figure 5:
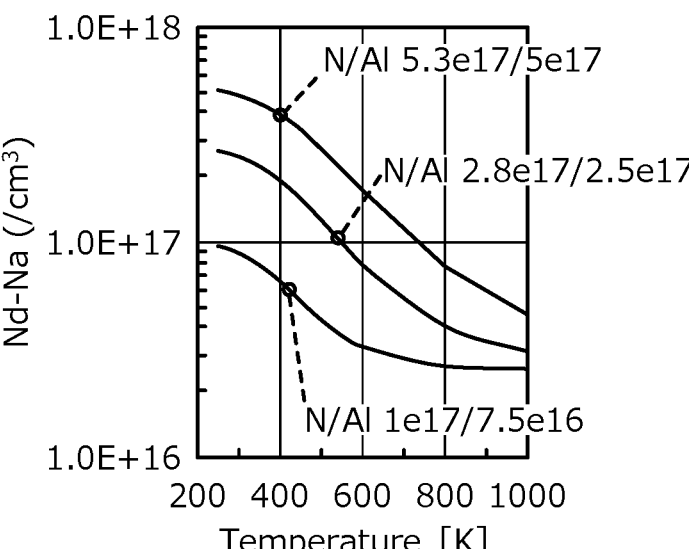
FIG. 5 is a graph of calculation results showing temperature dependency of effective donor concentration Nd—Na during N+Al co-doping.

Further, FIG. 5 is a graph of calculation results showing temperature dependency of the effective donor concentration Nd—Na during N+Al co-doping.

The effective donor concentration Nd—Na means an effective ionized donor concentration obtained by subtracting the acceptor concentration (for example, the ionized Al concentration) from the donor concentration Nd (for example, the ionized N concentration). In FIG. 5, a vertical axis indicates the effective donor concentration Nd—Na in units of/cm³. A horizontal axis indicates temperature in units of K. In FIG. 5, the ratio of the N concentration and the Al concentration was changed, and temperature dependence is depicted for three instances. For example, in FIG. 5, N/Al 5.3e17/5e17 is an example in which the N concentration is $5.3 \times 10^{17}$/cm³, the Al concentration is $5 \times 10^{17}$/cm³, and the Al/N ratio=0.94 (94%). Ionization of N is 100% even at temperatures closer to room temperature whereas the Al ionization rate is temperature dependent (FIG. 4) and thus, the effective donor concentration Nd—Na varies according to temperature. In FIG. 5, for N/Al 5.3e17/5e17, at room temperature (about 300K), 400K, 600K, and 800K, the effective donor concentration Nd—Na is 5e17, 4e17, 2e17, and 8e16, respectively, and decreases as the temperature increases. In other words, while the effective donor concentration Nd—Na at room temperature (about 300K) is mostly dominated by the N concentration, as the temperature rises and Al ionization progresses, carrier compensation occurs and the effective Nd—Na decreases.

Figures 6, 7:
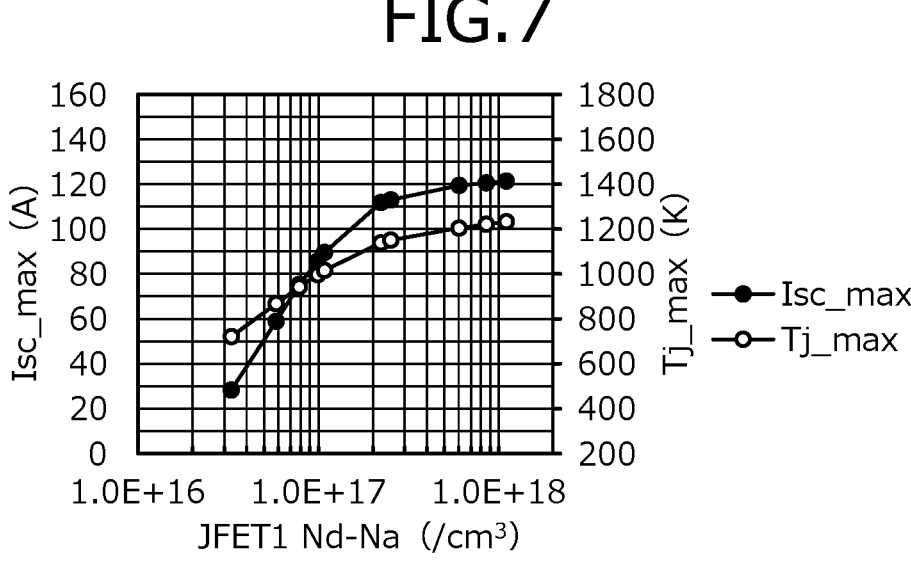
FIG. 6 is a graph of simulation results showing a relationship between short-circuit current and doping concentration of a JFET_1 region.
FIG. 7 is a graph of simulation results showing a relationship between short-circuit current and effective donor concentration of the JFET_1 region, and a relationship between the effective donor concentration of the JFET_1 region and device temperature.

Further, FIG. 6 is a graph of simulation results showing a relationship between short-circuit current and doping concentration of the JFET_1 region. In FIG. 6, a vertical axis indicates the drain current in units of A. A horizontal axis indicates the load short-circuit time in units of s. The JFET_1 regions 21 are portions of the second n-type regions 6b between sidewalls of the trenches 16 and the second p⁺-type regions 4b, and the JFET_2 regions 22 are portions of the first n-type regions 6a between the second p⁺-type base regions 5 and the first p⁺-type regions 4a (refer to FIGS. 1 to 3). In the figures, the doping concentrations indicated by 2.5E+17 to 3.3E+16 are the effective donor concentrations Nd—Na set at room temperature (300K). In these simulation results, at time 0, when short-circuit occurs, the drain current rapidly increases, but reaches a maximum value at about 1 μs and thereafter, decreases which is due to factors such as the resistance increasing due to heat generated by the device, whereby the current is limited. In an instance of doping of the JFET_1 region, while the device temperature increases and the effective donor concentration decreases, in the simulation, temperature fluctuation of the Al ionization rate of the JFET_1 region (FIG. 4) was not considered and the effective donor concentration was assumed to have the same value at the initially set value for room temperature in the figures, at any time on the horizontal axis. Accordingly, in FIG. 6, with consideration of decreases in the effective donor concentration due to temporal variation (temperature increase), behavior of the drain current changes from a high concentration waveform to a low concentration waveform with the elapse of time (temperature increase), in each simulation waveform indicated by 2.5E+17 to 3.3E+16.

Further, FIG. 7 is a graph of simulation results showing a relationship between short-circuit current and the effective donor concentration of the JFET_1 region, and a relationship between the effective donor concentration of the JFET_1 region and device temperature. In FIG. 7, a left vertical axis indicates short-circuit current (Isc max) in units of A while a right vertical axis indicates device temperature (Tj max) in units of K. As depicted by the calculation in FIG. 6, the short-circuit current (Isc max) is a maximum value of temporal variation of the drain current and the device temperature (Tj max) is a maximum junction temperature of the device during the short-circuit period. A horizontal axis indicates the effective donor concentration Nd—Na of the JFET_1 regions 21 in units of/cm³. As depicted in FIGS. 6 and 7, it is found that when Nd—Na of the JFET_1 regions 21 is low, short-circuit current during short-circuit significantly decreases.

Figures 8, 9A:
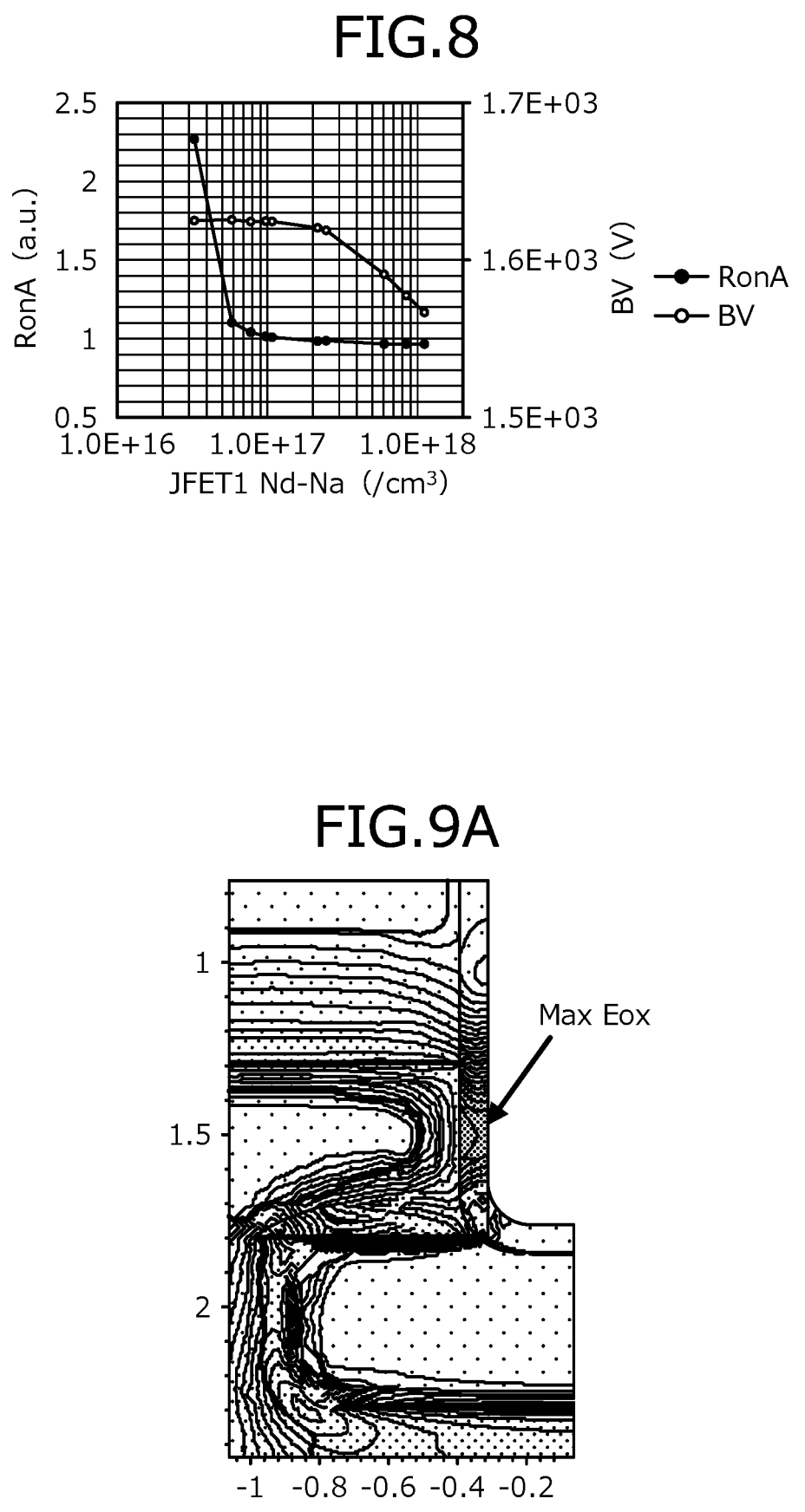

Further, FIG. 8 is a graph showing a relationship between the effective donor concentration of the JFET_1 region and on-resistance (RonA), and a relationship between the effective donor concentration of the JFET_1 region and breakdown voltage (BV). In FIG. 8, a left vertical axis indicates on-resistance (RonA) in a unit that is a relative unit assumed as 1 when the effective donor concentration of the JFET_1 regions 21 is $1.0 \times 10^{17}/\text{cm}^3$. A right vertical axis indicates breakdown voltage (BV) in units of V. A horizontal axis indicates the effective donor concentration Nd—Na of the JFET_1 regions 21 in units of/$\text{cm}^3$.

As depicted in FIG. 8, when the effective donor concentration Nd—Na of the JFET_1 regions 21 is lowered, the on-resistance increases. Therefore, in the embodiment, Al+N are co-doped (co-injected) a prescribed amount in the JFET_1 regions 21 so that the JFET_1 regions 21 are at least equal to a range (for example, $7.0 \times 10^{16}/\text{cm}^3$ or more) in which the on-resistance does not increase, whereby the impurity concentration of the JFET_1 regions 21 is increased around room temperature and decreased when the temperature is high thereby enabling suppression of increases in the on-resistance and suppression of short-circuit current.

Figure 9B:
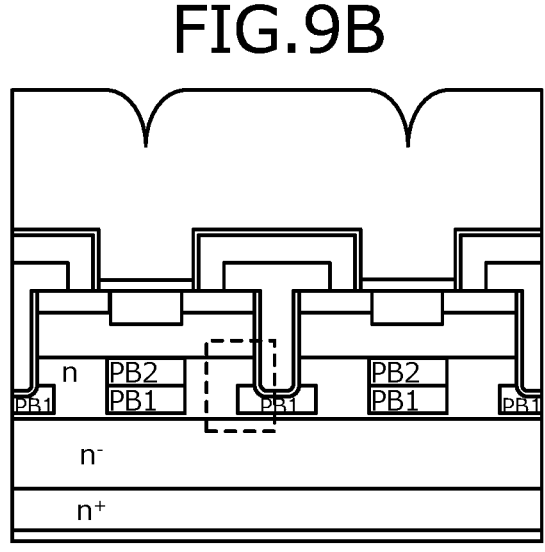
FIG. 9B is cross-sectional view of a vicinity of a trench bottom.
Figure 10:
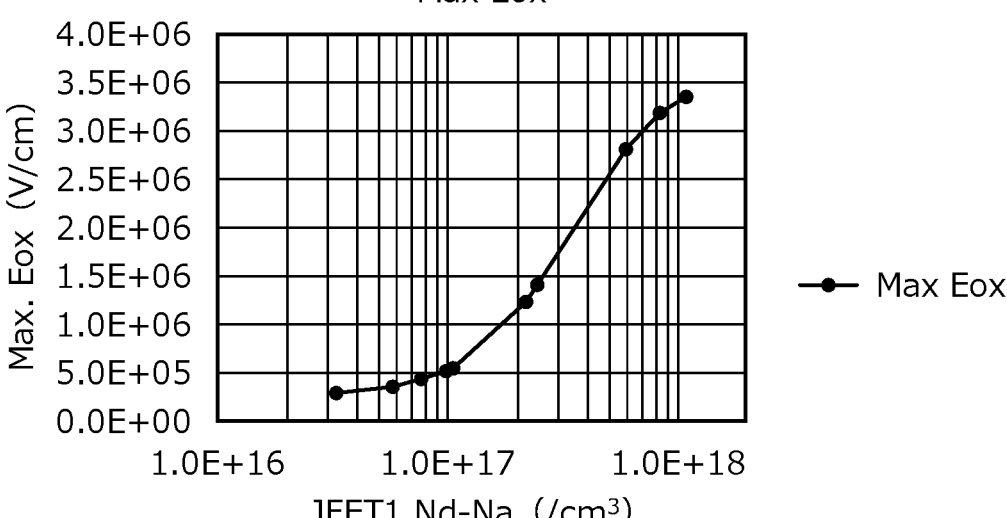
FIG. 10 is a graph showing a relationship between the effective donor concentration of the JFET_1 regions 21 the maximum electric field strength of the oxide film in FIGS. 9A and 9B.

Further, FIG. 9A is cross-sectional view depicting electric field of a portion surrounded by a dashed line in FIG. 9B, when the silicon carbide semiconductor device is off and FIG. 9B is cross-sectional view of a vicinity of a trench bottom, the electric field strength being indicated by contour lines. It is found that the electric field strength in an oxide film of a trench side surface is greatest at a portion where the oxide film and the JFET_1 regions 21 are in contact with each other. FIG. 10 is a graph showing a relationship between the effective donor concentration of the JFET_1 regions 21 the maximum electric field strength of the oxide film in FIGS. 9A and 9B. FIG. 9B depicts electric field when the silicon carbide semiconductor device is off and in which the drain voltage Vd is 600V, the gate voltage Vg is-5V, and the effective donor concentration Nd—Na of the JFET_1 regions 21 is $6.0 \times 10^{17}/\text{cm}^3$. In FIG. 10, a vertical axis indicates the maximum electric field of the oxide film (Max Eox) in units of V/cm while a horizontal axis indicates the effective donor concentration Nd—Na of the JFET_1 regions 21 in units of/$\text{cm}^3$.

As depicted in FIG. 10, when the effective donor concentration Nd—Na of the JFET_1 regions 21 increases, electric field of the oxide film increases during the off state. Assuming the value 3 MV/cm of the electric field of the oxide film to be the limit for maintaining long-term reliability (refer to Sumi Krishnaswami, et. al, *Mat. Sci. Forum* 527-529 (2006) pp. 1313), $7 \times 10^{17}/\text{cm}^3$ is the upper limit of the effective donor concentration Nd—Na of the JFET_1 regions 21.

As described, the upper limit of the N concentration is determined by the upper limit of the electric field of the oxide film of the off state while the lower limit is determined by the upper limit of increasing on-resistance. Further, the upper limit of the Al concentration is less than or equal to an N concentration whereby the JFET_1 regions 21 do not become a p-type. Further, the lower limit, as a concentration that greatly changes Nd—Na, may be preferably 10% or more of the N concentration. Thus, the JFET_1 regions 21 have an N concentration in a range of $7 \times 10^{16}/\text{cm}^3$ to $7 \times 10^{17}/\text{cm}^3$ and an Al concentration that preferably may be 10% or more of the N concentration but less than the N concentration (in other words, less than 100% of the N concentration). Further, when intentionally doping Al, the concentration may be preferably 30% or more of the N concentration. Further, the JFET_2 regions 22 may also be co-doped with a prescribed amount of Al+N. As a result, the impurity concentration of the JFET_2 regions 22 is increased close to room temperature and is lower when the temperature is high, whereby increases in the on-resistance and the short-circuit current may be suppressed.

Further, when the nitrogen concentration (/$\text{cm}^3$) is assumed to be "X", "a" is assumed to be a constant between 0.1 and 0.99, and the aluminum concentration (/$\text{cm}^3$) is assumed to be "aX", the nitrogen concentration X may be set to satisfy the following relationships.

$$X \geq (7 \times 10^{16})/(1-a) \qquad \text{expression (1)}$$

$$X \leq (7 \times 10^{17})/(1-a) \qquad \text{expression (2)}$$

In other words, "a" represents the Al/N ratio, expression (1) is the lower limit X min of the N concentration, and expression (2) is the upper limit of the N concentration X max. Calculation results of this relationship are depicted in table 1.

TABLE 1

| AI/N RATIO (a) | N CONCENTRATION LOWER LIMIT (Xmin) | N CONCENTRATION UPPER LIMIT (Xmax) |
|---|---|---|
| 0.1 | 7.8E+16 | 7.8E+17 |
| 0.2 | 8.8E+16 | 8.8E+17 |
| 0.3 | 1.0E+17 | 1.0E+18 |
| 0.4 | 1.2E+17 | 1.2E+18 |
| 0.5 | 1.4E+17 | 1.4E+18 |
| 0.6 | 1.8E+17 | 1.8E+18 |
| 0.7 | 2.3E+17 | 2.3E+18 |
| 0.8 | 3.5E+17 | 3.5E+18 |
| 0.9 | 7.0E+17 | 7.0E+18 |
| 0.95 | 1.4E+18 | 1.4E+19 |
| 0.99 | 7.0E+18 | 7.0E+19 |

The p-type base layer 3 is in contact with the first $p^+$-type base regions 4. In the p-type base layer 3, at the base first main surface side, the $n^+$-type source regions (first semiconductor regions of the n-type) 7 is provided. Further, the $p^{++}$-type contact regions 8 may be selectively provided. In this case, the $n^+$-type source regions 7 and the $p^{++}$-type contact regions 8 are in contact with one another.

The n-type high-concentration regions 6 may be provided in a region between the first $p^+$-type base regions 4 and the second $p^+$-type base regions 5 of a surface layer of the $n^-$-type silicon carbide epitaxial layer 2, at the base first main surface side and in a region between the p-type base layer 3 and the second $p^+$-type base regions 5 and the n-type high-concentration regions 6 may be formed to positions deeper that those of the first $p^+$-type base regions 4 and the second $p^+$-type base regions 5. Thus, the depth (thickness) of the n-type high-concentration regions 6 is greater than the depth (thickness) of the first $p^+$-type base regions 4 and the depth (thickness) of the second $p^+$-type base regions 5. Further, the first $p^+$-type base regions 4 and the second $p^+$-type base regions 5 may be formed positions of the same depth. Further, at sides of the first $p^+$-type base regions 4 and the second $p^+$-type base regions 5 facing the drain, the n-type high-concentration regions 6 may be provided so as to surround the first $p^+$-type base regions 4 and the second $p^+$-type base regions 5.

In FIG. 1, while on each side of one trench MOS structure, one half of a structure of a trench MOS structure is depicted, many more MOS gate (metal-oxide film-semiconductor insulated gates) structures of the trench structure may be disposed periodically in parallel.

In an entire area of the first main surface of the silicon carbide semiconductor base, the interlayer insulating film 11 is provided so as to cover the gate electrodes 10 embedded in the trenches. The ohmic electrodes 12 in contact with the n⁺-type source regions 7 via contact holes opened in the interlayer insulating film 11, and the source electrode (first electrode) 14 that covers the p-type base layer 3 and the ohmic electrodes 12 are provided. In an instance in which the p⁺⁺-type contact regions 8 are provided, the ohmic electrodes 12 are in contact with the n⁺-type source regions 7 and the p⁺⁺-type contact regions 8. The ohmic electrodes 12 are electrically insulated from the gate electrodes 10 by the interlayer insulating film 11.

Next, a method of manufacturing the silicon carbide semiconductor device according to the embodiment is described. FIGS. 11, 12, 13, 14, 15, 16, 17, and 18 are cross-sectional views depicting states of the silicon carbide semiconductor device according to the embodiment during manufacture.

Figure 11:
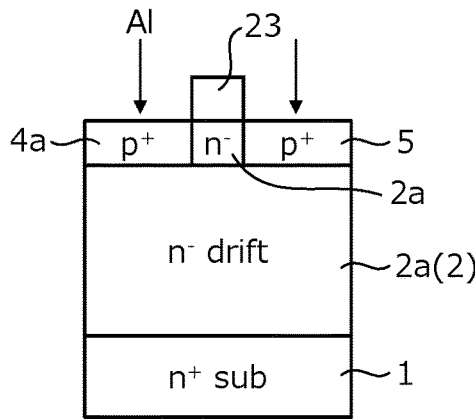
FIG. 11 is a cross-sectional view depicting a state of the silicon carbide semiconductor device according to the embodiment during manufacture.

First, as depicted in FIG. 11, the n⁺-type silicon carbide substrate 1 containing silicon carbide of an n-type is prepared. Subsequently, on the first main surface of the n⁺-type silicon carbide substrate 1, a first n⁻-type silicon carbide epitaxial layer 2a containing silicon carbide is epitaxially grown while an n-type impurity, for example, nitrogen atoms is doped, the first n⁻-type silicon carbide epitaxial layer 2a being grown to a thickness of, for example, about 30 μm. The first n⁻-type silicon carbide epitaxial layer 2a constitutes the n⁻-type silicon carbide epitaxial layer 2. Assuming a breakdown voltage class in a range of 600V to 6.5 kV, while the impurity concentration of the n⁺-type silicon carbide substrate 1 is, for example, about 8e18/cm³, the impurity concentration may be in a range of 1e18/cm³ to 1e19/cm³ and while an impurity concentration of the first n⁻-type silicon carbide epitaxial layer 2a is, for example, about 3e15, the impurity concentration may be in a range of 1e15/cm³ to 2e16/cm³.

Next, on the surface of the first n⁻-type silicon carbide epitaxial layer 2a, a mask 23 having predetermined openings is formed by photolithography using, for example, an oxide film. Subsequently, by an ion implantation method using the oxide film as the mask 23, a p-type impurity, for example, aluminum atoms, is ion-implanted. As a result, as depicted in FIG. 11, in a portion of the first n⁻-type silicon carbide epitaxial layer 2a, at the surface thereof, for example, the first p⁺-type regions 4a and the second p⁺-type base regions 5 of a depth of, for example, about 0.5 μm are formed so that a distance between any adjacent two of the first p⁺-type regions 4a and the second p⁺-type base regions 5 is about 1.5 μm. While a does amount of Al during the ion implantation for forming the first p⁺-type regions 4a and the second p⁺-type base regions 5 is set so that the impurity concentration of the first p⁺-type regions 4a and the second p⁺-type base regions 5 becomes, for example, about 3e18/cm³, a range of 1e18/cm³ to 6e18/cm³ may be set. The state up to here is depicted in FIG. 11.

Figure 12:
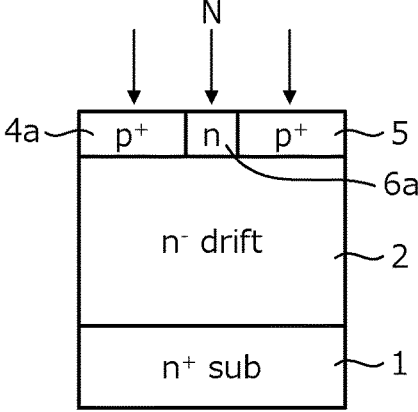
FIG. 12 is a cross-sectional view depicting a state of the silicon carbide semiconductor device according to the embodiment during manufacture.

Next, as depicted in FIG. 12, the mask 23 used in the ion implantation for forming the first p⁺-type regions 4a and the second p⁺-type base regions 5 is removed. Subsequently, an n-type impurity, for example, nitrogen atoms may be ion-implanted by an ion implantation method. As a result, as depicted in FIG. 12, between the first p⁺-type regions 4a and the second p⁺-type base regions 5 in the first n⁻-type silicon carbide epitaxial layer 2a, at the surface thereof, the first n-type regions 6a is formed to a position about 0.2 to 0.5 μm deeper than the first p⁺-type regions 4a and the second p⁺-type base regions 5. Here, the first n-type regions 6a are formed so as to surround, respectively, lower sides (respective sides facing the n⁺-type silicon carbide substrate 1) of the first p⁺-type regions 4a and the second p⁺-type base regions 5. A dose amount during an ion implantation for forming the first n-type regions 6a may be set so that, for example, the impurity concentration becomes about 5×10¹⁶/cm³. The first p⁺-type regions 4a and the second p⁺-type base regions 5 are set so that, for example, Al becomes about 3e18 and in these regions as well, while nitrogen is ion-implanted, since the impurity concentration of the nitrogen is about two orders of magnitude smaller and has almost no effect, a mask is omitted in this process. In when there is concern of adverse impact, the first p⁺-type regions 4a and the second p⁺-type base regions 5 may be covered by a mask. The state up to here is depicted in FIG. 12.

Figure 13:
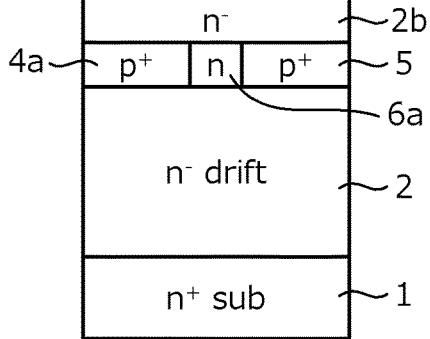
FIG. 13 is a cross-sectional view depicting a state of the silicon carbide semiconductor device according to the embodiment during manufacture.

Next, as depicted in FIG. 13, on the surface of the first n⁻-type silicon carbide epitaxial layer 2a, a second n⁻-type silicon carbide epitaxial layer 2b is epitaxially grown having a thickness of, for example, about 0.5 μm while an n-type impurity, for example, nitrogen atoms is doped. A layer formed by a combination of the second n⁻-type silicon carbide epitaxial layer 2b, the first n⁻-type silicon carbide epitaxial layer 2a, and the n⁻-type silicon carbide epitaxial layer 2 constitutes the first semiconductor layer. Conditions of the epitaxial growth for forming the second n⁻-type silicon carbide epitaxial layer 2b may be set so that, for example, the impurity concentration of the second n⁻-type silicon carbide epitaxial layer 2b becomes about 3×10¹⁵/cm³. The state up to here is depicted in FIG. 13.

Figure 14:
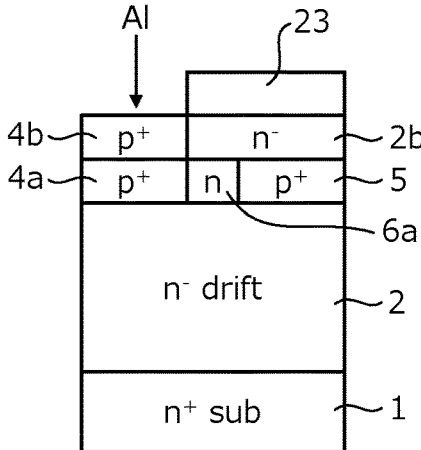
FIG. 14 is a cross-sectional view depicting a state of the silicon carbide semiconductor device according to the embodiment during manufacture.

Next, as depicted in FIG. 14, on the surface of the n⁻-type silicon carbide epitaxial layer 2, the mask 23 having predetermined openings is formed by photolithography using, for example, an oxide film. Subsequently, by an ion implantation method using the oxide film as the mask 23, a p-type impurity, for example, aluminum atoms, is ion-implanted. As a result, as depicted in FIG. 14, in a portion of the n⁻-type silicon carbide epitaxial layer 2, at the surface thereof, for example, the second p⁺-type regions 4b of a depth of about 0.5 μm, for example, are formed so as to overlap upper portions of the first p⁺-type regions 4a, respectively. The second p⁺-type regions 4b and the first p⁺-type regions 4a combined constitute the first p⁺-type base regions 4. The state up to here is depicted in FIG. 14.

Figure 15:
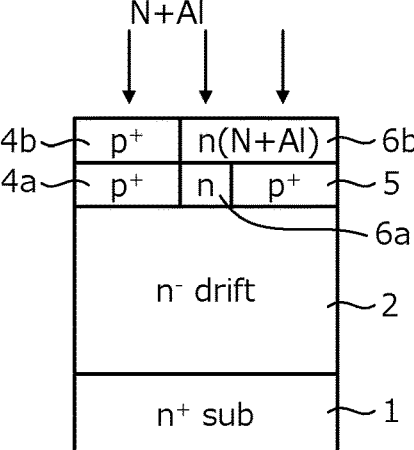
FIG. 15 is a cross-sectional view depicting a state of the silicon carbide semiconductor device according to the embodiment during manufacture.

Next, as depicted in FIG. 15, the mask 23 used during the ion implantation for forming the second p⁺-type regions 4b is removed. Subsequently, an n-type impurity, for example, nitrogen atoms and a p-type impurity, for example, aluminum atoms are co-ion implanted at the same positions by an ion implantation method. As a result, as depicted in FIG. 15, in the second n⁻-type silicon carbide epitaxial layer 2b, at the surface thereof, the second n-type regions 6b of a depth of, for example, about 0.5 μm are formed so as to be in contact with the first p⁺-type regions 4a, the second p⁺-type base regions 5, the first n-type regions 6a. The second n-type regions 6b and the first n-type regions 6a combined constitute the n-type high-concentration regions 6. As described, the second n-type regions 6b constitute the JFET_1 regions 21. The first p⁺-type base regions 4 (4a, 4b), the second p⁺-type base regions 5, and the n-type high-concentration regions 6 (6a,6b) are formed as a portion of the first semiconductor layer. When an n-type impurity is ion-implanted to adjust the concentration of a conventional JFET region, a p-type impurity, for example, Al is co-doped, whereby the effective donor concentration Nd—Na of the JFET_1 regions 21 may be set to have N of a concentration in a range of $7 \times 10^{16}/cm^3$ to $7 \times 10^{17}/cm^3$ and Al of a concentration in a range of 10% or more of the N concentration but not more than the N concentration. The second p⁺-type regions 4b are set so that, for example, Al becomes about 3e18 and in these regions as well, while nitrogen and Al are ion implanted, an instance is not affected, in which the concentration difference of the nitrogen and the Al to be implanted is less than the concentration of the second p⁺-type regions 4b by an order of magnitude of two or more. In an instance in which the concentration difference is greater than this, to suppress any impact, the Al concentration of the second p⁺-type regions 4b may be set high in advance or implantation may be performed with the second p⁺-type regions 4b covered by a mask. The state up to here is depicted in FIG. 15.

Figure 16:
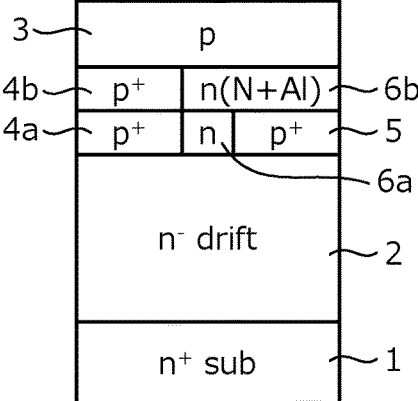
FIG. 16 is a cross-sectional view depicting a state of the silicon carbide semiconductor device according to the embodiment during manufacture.

Next, as depicted in FIG. 16, on the surface (in other words, the surfaces of the first p⁺-type base regions 4 and the second n-type regions 6b) of the n⁻-type silicon carbide epitaxial layer 2, the p-type base layer 3 having a thickness of, for example, about 1.3 μm is epitaxially grown while a p-type impurity, for example, aluminum atoms, is doped. Conditions of the epitaxial growth for forming the p-type base layer 3, for example, may be set so that the impurity concentration becomes about $4 \times 10^{17}/cm^3$, lower than the impurity concentration of the first p⁺-type base regions 4. By the processes up to here, the silicon carbide semiconductor base in which the n⁻-type silicon carbide epitaxial layer 2 and the p-type base layer 3 are stacked on the n⁺-type silicon carbide substrate 1 is formed. The state up to here is depicted in FIG. 16.

Next, as depicted in FIG. 17, on the surface of the p-type base layer 3, a non-depicted mask having predetermined openings is formed by photolithography using, for example, an oxide film. Subsequently, by ion implantation using this oxide film as a mask, an n-type impurity, for example, N or phosphorus (P) is ion implanted. As a result, as depicted in FIG. 17, the n⁺-type source regions 7 are formed in portions of the p-type base layer 3, at the surface thereof.

Next, the mask used during the ion implantation for forming the n⁺-type source regions 7 is removed. Subsequently, on the surface of the exposed p-type base layer 3, a non-depicted mask having predetermined openings is formed by photolithography using, for example, an oxide film and using this oxide film as a mask, at the surface of the p-type base layer 3, a p-type impurity, for example, aluminum is ion implanted. As a result, in regions of the p-type base layer 3, at the surface thereof, the p⁺⁺-type contact regions 8 are formed. A dose amount during the ion implantation for forming the p⁺⁺-type contact regions 8 may be set so that, for example, the impurity concentration becomes higher than that of the second p⁺-type base regions 4. The sequence of the ion implantation for forming the n⁺-type source regions 7 and the ion implantation for forming the p⁺⁺-type contact regions 8 may be interchanged. The state up to here is depicted in FIG. 17.

Subsequently, by dry etching, after the p-type base layer 3 of a chip outer peripheral portion is removed and the device is separated, in the outer peripheral portions, for example, a voltage withstanding structure (not depicted) such as a junction termination extension (JTE) is formed by ion implantation of Al.

Next, a heat treatment (annealing) is performed and, for example, the first p⁺-type regions 4a, the second p⁺-type regions 4b, the n⁺-type source regions 7, and the p⁺⁺-type contact regions 8 are activated. A temperature of the heat treatment may be, for example, about 1700 degrees C. A period of the heat treatment may be, for example, about two minutes. As described above, the ion-implanted regions may be collectively activated by one session of the heat treatment or may be activated by performing the heat treatment each time ion implantation is performed.

Next, as depicted in FIG. 18, on the surface (in other words, the surfaces of the n⁺-type source regions 7 and the p⁺⁺-type contact regions 8) of the p-type base layer 3, a non-depicted mask having predetermined openings is formed by photolithography using, for example, an oxide film. Subsequently, by dry etching, etc. using the oxide film as a mask, the trenches 16 that penetrate through the n⁺-type source regions 7 and the p-type base layer 3 and reach the n-type high-concentration regions 6 are formed. The bottoms of the trenches 16 may reach the second p⁺-type base regions 5 or may be at positions in the n-type high-concentration regions 6 surrounded by the p-type base layer 3 and the second p⁺-type base regions 5. Subsequently, the mask used to form the trench 16 is removed. The state up to here is depicted in FIG. 18.

Next, a field oxide film (not depicted) is deposited at the surface of the chip outer peripheral portion and thereafter, the gate insulating film 9 is formed along the surfaces of the n⁺-type source regions 7 and the p⁺⁺-type contact regions 8, and the bottoms and the sidewalls of the trenches 16. The gate insulating film 9 may be formed by a heat treatment at a temperature of about 1000 degrees C. under an oxygen atmosphere. Further, the gate insulating film 9 may be formed by a method of depositing by a chemical reaction such as that for a high temperature oxide (HTO).

Next, on the gate insulating film 9, a polycrystalline silicon layer doped with, for example, phosphorus atoms, is formed. The polycrystalline silicon layer is formed so as to be embedded in the trenches 16. The polycrystalline silicon layer is patterned and left in the trenches 16, thereby forming the gate electrodes 10. A portion of each of the gate electrodes 10 may protrude from a top (upper side facing the source electrode 14) of each of the trenches 16.

Next, so as to cover the gate insulating film 9 and the gate electrode 10, for example, a phosphate glass of a thickness of about 1 μm is deposited, thereby forming the interlayer insulating film 11. The interlayer insulating film 11 and the gate insulating film 9 are patterned and selectively removed, thereby forming contact holes and thus, exposing the n⁺-type source regions 7 and the p⁺⁺-type contact regions 8. At the surface of the interlayer insulating film 11, the barrier metal 15 containing titanium, titanium nitride, etc. is formed.

Next, for example, by a sputtering method, the ohmic electrodes 12 that are in contact with the n⁺-type source regions 7 and the p⁺⁺-type contact regions 8 are formed. Thereafter, a heat treatment (sintering) for forming an alloy layer is performed. Next, for example, by a sputtering method, so as to cover the barrier metal 15 on the ohmic electrodes 12 and the interlayer insulating film 11, for example, an aluminum film of a thickness of, for example, about 5 μm is provided. Thereafter, the aluminum film is selectively removed and left so as to cover the active region of the device overall, thereby forming the source electrode 14 and a gate electrode pad (not depicted).

Thereafter, as a surface passivation film, a polyimide is applied by, for example, spin-coating and patterned by photolithography and a heat treatment (curing) is performed. Next, for example, by a vapor deposition method, at the second main surface of the n⁺-type silicon carbide substrate 1, for example, titanium (Ti), nickel (Ni), and gold (Au) are sequentially stacked, thereby forming the drain electrode 13. As described, the semiconductor device depicted in FIGS. 1 to 3 is completed.

As described above, according to the embodiments, N and Al are doped concurrently in the JFET_1 region. Variation of the Al ionization rate according to temperature is taken advantage of and during high temperatures, the concentration of the JFET_1 region is reduced, whereby the JFET resistance may be increased when the temperature becomes high due to short-circuiting and short-circuit current may be suppressed. Thus, short-circuit current may be lower and the short-circuit capability may be improved while the device on-resistance is maintained as is. Further, in the embodiments, while an instance of a device temperature of 300K to 448K as an actual operating temperature is described, without limitation hereto, for example, 233K to 524K may be set as the actual operating temperature. In a p-type SiC doped with aluminum, resistance increases at subzero temperatures. A reason for this is that the ionization rate of aluminum decreases at lower temperatures and free carrier density decreases. In the embodiment is an instance in which nitrogen and aluminum are of a predetermined amount and during low temperatures, it is conceivable that only the nitrogen concentration is a certain concentration and thus, is effective even at subzero temperatures (for example, 233K).

As for the doping of N and Al of the JFET_1 region, provided the predetermined impurity concentrations are set, instead of concurrent doping, for example, by multistage epitaxial growth, an n-type epitaxial layer with nitrogen as a dopant is formed and thereafter, aluminum may be ion-implanted or a p-type epitaxial layer with aluminum as a dopant may be formed and thereafter, nitrogen may be ion-implanted. Further, during epitaxial growth, nitrogen and aluminum may be doped. Furthermore, as an n-type dopant, while an example using nitrogen has been described, without limitation hereto, instead of nitrogen, phosphorus may be used, and phosphorus and aluminum may be doped. As the n-type dopant, nitrogen or phosphorus may be used and thus, these n-type impurities, when are referred to collectively, may be called donors.

In the foregoing, the present invention may be variously modified within a range not departing from the spirit of the invention and in the embodiments described above, for example, dimensions, impurity concentrations, etc. of parts may be variously set according to necessary specifications.

According to the invention described above, the JFET_1 region (first semiconductor layer between a trench and a first base region) is doped concurrently with Al and a donor containing any one of N and P. Variation of the ionization rate of Al according to temperature is used to reduce the n-type concentration of the JFET_1 region during high temperatures and thus, when short-circuit occurs and the temperature increases, JFET resistance is increased and the short-circuit current can be suppressed. Thus, the short-circuit current is lowered while the device on-resistance is maintained as is, thereby, enabling improvement of the short-circuit capability.

According to the silicon carbide semiconductor device of the present invention, an effect is achieved in that short-circuit capability may be improved while device on-resistance is maintained as is.

As described above, the silicon carbide semiconductor device according to the present invention is useful for power semiconductor devices used in power converting equipment such as inverters, etc., power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor substrate of an n-type and having a first main surface and a second main surface that are opposite to each other;
a first semiconductor layer of the n-type, provided at the first main surface of the silicon carbide semiconductor substrate, the first semiconductor layer having an impurity concentration lower than an impurity concentration of the silicon carbide semiconductor substrate, the first semiconductor layer having a first surface and a second surface that are opposite to each other, the second surface facing the silicon carbide semiconductor substrate;
a first JFET region of the n-type, provided in the first semiconductor layer, at the first surface thereof, the first JFET region having an effective donor concentration that is higher than an effective donor concentration of the first semiconductor layer;
a second semiconductor layer of a p-type, provided at the first surface of the first semiconductor layer, the second semiconductor layer having a first surface and a second surface that are opposite to each other, the second surface of the second semiconductor layer facing the first semiconductor layer;
a first semiconductor region of the n-type, selectively provided in the second semiconductor layer, at the first surface thereof;
a trench penetrating through the first semiconductor region, the second semiconductor layer, and the first JFET region;
a gate electrode provided in the trench, via a gate insulating film;
an interlayer insulating film provided on the gate electrode;
a first electrode in contact with the first semiconductor region and the second semiconductor layer; and
a second electrode provided at the second main surface of the silicon carbide semiconductor substrate, wherein
in a layer or a region, an effective donor concentration thereof is obtained by subtracting a concentration of an acceptor thereof from a concentration of a donor thereof, and
the first JFET region is doped with an acceptor that is aluminum and with a donor that is nitrogen or phosphorus, a concentration of the donor is greater than a concentration of the acceptor.

2. The silicon carbide semiconductor device according to claim 1, wherein
in the first JFET region, the concentration of the donor is in a range of $7\times10^{16}$/cm$^3$ to $7\times10^{17}$/cm$^3$, and the concentration of the acceptor is in a range of 10% to less than 100% of the concentration of the donor.

3. The silicon carbide semiconductor device according to claim 1, wherein
in the first JFET region, designating the concentration of the donor as X (/cm$^3$), and the concentration of the acceptor as aX (/cm$^3$), X satisfies the following the relationships:

$$X \geq (7 \times 10^{16})/(1-a),$$

$$X \leq (7 \times 10^{17})/(1-a),$$

where, "a" is a constant between 0.1 and 0.99.

4. The silicon carbide semiconductor device according to claim 1, wherein the effective donor concentration of the first JFET region is in a range of $7 \times 10^{16}/cm^3$ to $7 \times 10^{17}/cm^3$.

5. The silicon carbide semiconductor device according to claim 4, wherein the effective donor concentration varies depending on an operating temperature of the device, and the effective donor concentration of the first JFET region has the range of $7 \times 10^{16}/cm^3$ to $7 \times 10^{17}/cm^3$ when the operating temperature is in a range of 245K to 524K.

6. The silicon carbide semiconductor device according to claim 4, wherein the effective donor concentration varies depending on an operating temperature of the device, and the effective donor concentration of the first JFET region has the range of $7 \times 10^{16}/cm^3$ to $7 \times 10^{17}/cm^3$ when the operating temperature is in a range of 300K to 448K.

7. The silicon carbide semiconductor device according to claim 1, wherein the first semiconductor layer has:

a drift layer having a same impurity concentration as the impurity concentration of the first semiconductor layer, and a second JFET region of an n-type, provided between the first JFET regions and the drift layer, the second JFET region having an effective donor concentration that is higher than an effective donor concentration of the drift layer.

8. The silicon carbide semiconductor device according to claim 7, wherein the second JFET region is doped with a donor and with an acceptor that is aluminum, and in the second JFET region, a concentration of the donor is greater than a concentration of the acceptor.

9. The silicon carbide semiconductor device according to claim 1, further comprising:

a plurality of first base regions of the p-type, provided in the first semiconductor layer, the trench being provided in plurality, the plurality of trenches being periodically disposed, each of the plurality of first base regions being provided between a corresponding adjacent two of the plurality of trenches so as to divide the first JFET region, and being in contact with the second semiconductor layer; and a plurality of second base regions of the p-type, each provided in the first semiconductor layer, at positions facing, in a depth direction, a bottom of a corresponding one of the plurality of trenches.

\* \* \* \* \*